United States Patent [19]

Hosoya et al.

[11] Patent Number: 4,942,314

[45] Date of Patent: Jul. 17, 1990

[54] PEAK HOLDING CIRCUIT FOR A COLOR TELEVISION RECEIVER

[75] Inventors: Nobukazu Hosoya, Nara; Kazunori Nohara, Osaka; Yasuyuki Ikeguchi, Higashiosaka; Tooru Sasaki, Matsubara; Yoshichika Hirao, Neyagawa, all of Japan

[73] Assignee: Sanyo Electric Co., Ltd., Moriguchi, Japan

[21] Appl. No.: 245,179

[22] Filed: Sep. 16, 1988

[30] Foreign Application Priority Data

Sep. 18, 1987 [JP] Japan .............................. 62-235428
Sep. 18, 1987 [JP] Japan .............................. 62-235430

[51] Int. Cl.⁵ .................... H04N 5/18; H03K 5/159
[52] U.S. Cl. .................................. 307/352; 307/315; 318/151; 358/27
[58] Field of Search ............... 358/27, 34, 40, 74; 307/238.1, 352, 353, 315; 328/151

[56] References Cited

FOREIGN PATENT DOCUMENTS 126817 11/1978 Japan .
14072 3/1982 Japan .
42242 9/1982 Japan .

Primary Examiner—Edward L. Coles, Sr.
Assistant Examiner—Robert M. Bauer
Attorney, Agent, or Firm—Armstrong, Nikaido, Marmelstein, Kubovcik & Kubovcik

[57] ABSTRACT

A peak holding circuit comprises a capacitor for holding signal charges corresponding to a peak level of an input signal, and a current amplifier circuit comprising transistors connected in a triple darlington manner for supplying an output current corresponding to the held charges. An emitter of a transistor in the first stage out of the transistors connected in a darlington manner is connected to a collector of another transistor through which a collector cut-off current flows which is approximately equal to a collector cut-off current flowing through the transistor in the first stage. The other transistor has its emitter connected to ground. Therefore, the collector cut-off current flowing through the transistor in the first stage is cancelled, so that fluctuations in output current can be prevented even if a large reactive current is not allowed to flow through a transistor in the final stage out of the transistors connected in a darlington manner.

6 Claims, 7 Drawing Sheets

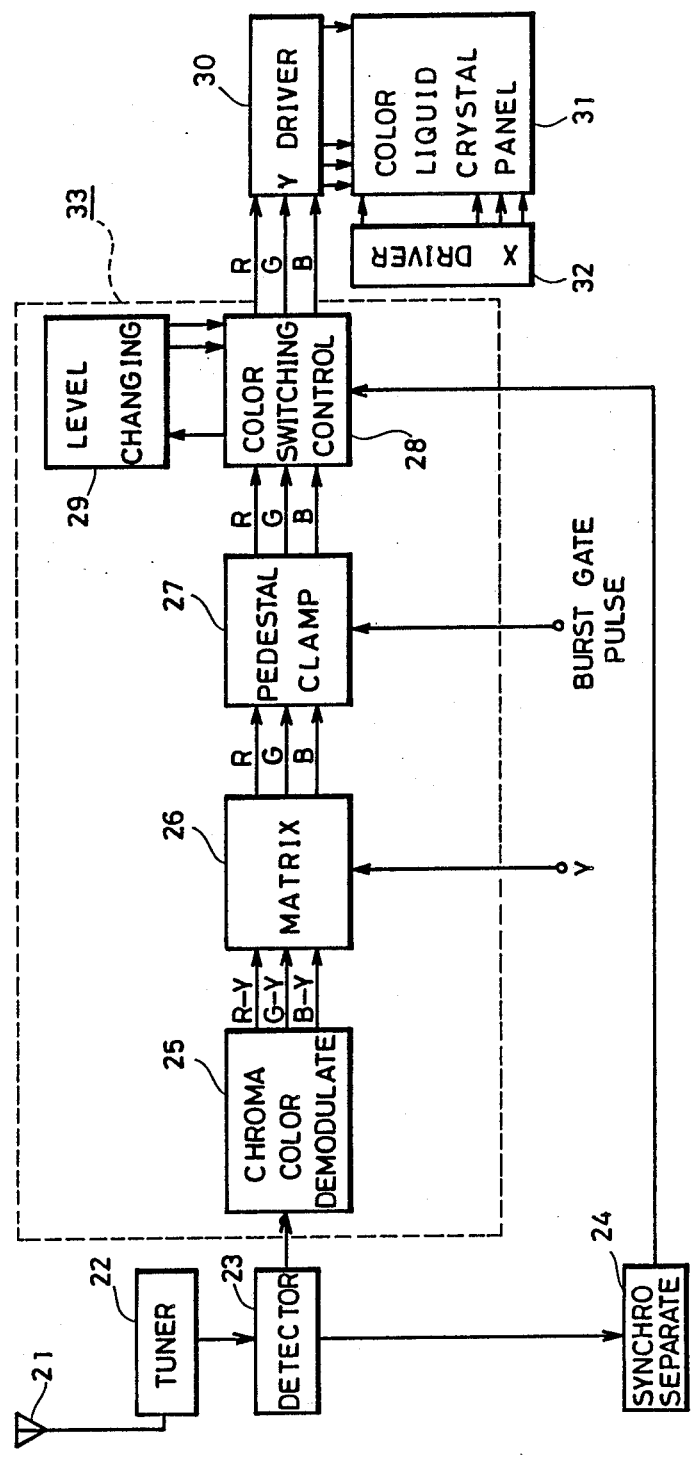

PEAK HOLDING CIRCUIT FOR A COLOR TELEVISION RECEIVER

BACKGROUND OF THE INVENTION

1. Field of the Invention

The present invention relates generally to a peak holding circuit, and more particularly, to a peak holding circuit formed as an integrated circuit to be employed in a color television receiver such as a liquid crystal color television receiver.

2. Description of the Prior Art

In general, if a capacitance is formed in an integrated circuit (IC), the capacitance value thereof is restricted to several 10 pF or less due to various restrictions in integrated circuit fabrication. Therefore, when a large capacitance is required, a capacitor is in general externally connected to the integrated circuit. As one example of such external connection, it is known that a holding capacitor in a peak holding circuit employed as an automatic chroma control circuit (ACC circuit) or the like in a chrominance signal reproducing circuit in a color television receiver is externally connected to an integrated circuit, which is disclosed in, for example, Japanese Patent Publication No. 14072/1982.

However, a method is proposed for forming a capacitor in an integrated circuit without making such external connection.

FIG. 1 is a block diagram showing schematically a structure of a color television receiver including an ACC circuit adapted such that a capacitor is formed in an integrated circuit as described above.

In FIG. 1, a color television signal is received by a receiving antenna 1 and a tuner 2, from which a video signal is further extracted by a detector circuit 3. The extracted video signal is applied to a video amplifier circuit 4, to be amplified. An output of the video amplifier circuit 4 is applied to a band pass amplifier circuit 5 and a color output circuit 6. The band pass amplifier circuit 5 extracts a carrier chrominance signal and a color burst from the applied video signal, and applies the carrier chrominance signal to a color demodulator circuit 7 and applies a composite chrominance signal comprising the carrier chrominance signal and the color burst to a burst gate circuit 8. The burst gate circuit 8 is responsive to a burst gate pulse generated by a well-known synchronizing separator circuit (not shown) and a burst gate pulse generating circuit (not shown) for extracting the color burst from the received composite chrominance signal and applying the same to an ACC circuit 9 and a color synchronizing circuit 10. The color synchronizing circuit 10 generates a color subcarrier which is synchronized with the applied color burst and applies the same to the color demodulator circuit 7.

The color demodulator circuit 7 extracts a color difference signal from the carrier chrominance signal using this color subcarrier and applies the same to the color output circuit 6. A color picture tube 11 is driven in response to an output signal of the color output circuit 6.

On the other hand, the ACC circuit 9 automatically adjusts the gain of the band pass amplifier circuit 5 such that a level of the carrier chrominance signal applied to the color demodulator circuit 7 from the band pass amplifier circuit 5 is kept constant. More specifically, the ACC circuit 9 is adapted to detect the magnitude of the color burst extracted by the burst gate circuit 8 and to decrease the gain of the band pass amplifier circuit 5 if the color burst becomes large to keep constant the level difference between a luminance signal and the carrier chrominance signal such that the depth of color of a picture becomes constant.

More specifically, the color burst applied to the ACC circuit 9 from the burst gate circuit 8 is first applied to a well-known ACC detector circuit $9a$ structured by a double-balanced differential amplifier. This ACC detector circuit $9a$ demodulates the applied color burst and applies a detected output to a base of a transistor $Q_1$. The transistor $Q_1$ is responsive to this detected output to be turned on only in a burst period. A peak holding capacitor $C_1$ is connected between an emitter of the transistor $Q_1$ and a ground potential. In the burst period, signal charges corresponding to a peak value of the color burst are charged in this capacitor $C_1$ through the transistor $Q_1$. In addition, there are provided transistors $Q_2$, $Q_3$ and $Q_4$ connected in a triple darlington manner. The transistor $Q_2$ has its base connected to the emitter of the transistor $Q_1$ and one electrode of the capacitor $C_1$. Furthermore, an emitter output of the transistor $Q_4$ is applied to a variable gain control type ACC amplifier circuit $9b$ as well as to a collector of a transistor $Q_5$ serving as a constant current source.

In the above described ACC circuit 9, the input impedance of a darlington circuit comprising the transistors $Q_2$ to $Q_4$ is large, so that a sufficient emitter output of the transistor $Q_4$ can be obtained by only supplying a small amount of current. In other words, even if the capacitance value of the capacitor $C_1$ is decreased (specifically, several 10 pF or less), the driving capability is sufficient. As a result, the peak holding capacitor $C_1$ can be formed in the integrated circuit.

However, the ACC circuit 9 shown in FIG. 1 has the following two disadvantages.

The first disadvantage is that since a collector cut-off current flowing through the transistor $Q_2$ in the first stage out of the transistors connected in a darlington manner, i.e., a current flowing between a collector and an emitter of the transistor when a base and the emitter thereof are short-circuited through a resistor is amplified by the transistors $Q_3$ and $Q_4$ in the succeeding stages, more current than necessary flows through the transistor $Q_4$ in the final stage even if the transistor $Q_2$ in the first stage is off.

More specifically, assuming that current amplification factors of the transistors $Q_2$, $Q_3$ and $Q_4$ are respectively $B_1$, $B_2$ and $B_3$, collector cut-off currents thereof are respectively $I_{CER1}$, $I_{CER2}$ and $I_{CER3}$, and a current flowing through the transistor $Q_4$ in the final stage is IF, we obtain:

$$IF = (I_{CER1} \times B_2 + I_{CER2}) \times B_3 + I_{CER3}$$

where $$I_{CER1} \cdot B_2 >> I_{CER2}$$

$$I_{CER1} \cdot B_2 \cdot B_3 >> I_{CER3}$$

and thus $$IF \approx I_{CER2} \cdot B_2 \cdot B_3$$

If concrete numerical values are substituted to calculate the above described IF, we obtain:

$$IF \approx 0.01 \mu A \times 300 \times 300 = 0.9 mA$$

Thus, if such a current IF flows, an output potential of the transistor $Q_4$ is unnecessarily raised in a period other than the burst period, i.e., in an off period of the transistor $Q_2$, so that the ACC circuit can not perform a normal operation. In order to control such rise in output potential, a reactive current $I_0$ larger than the above described current IF, for example, approximately 1 mA must be allowed to flow through the transistor $Q_5$ serving as a constant current source. Thus, a method has been known for compensating for an unnecessary change in potential at the time of no signal by a transistor separately provided, which is disclosed in, for example, Japanese Patent Publication No. 42242/1982.

However, if a constant current source is provided such that a reactive current of 1 mA is always allowed to flow as described above, power consumption is increased.

The second disadvantage is that ripple occurs in a voltage held in the peak holding capacitor $C_1$. FIG. 2 is a diagram showing the change with time of a voltage held in the holding capacitor $C_1$ shown in FIG. 1. Referring now to FIG. 2, description is made on occurrence of ripple.

First, the transistor $Q_1$ is turned on in the burst period (the period of $t_0$ to $t_1$ shown in FIG. 2) as described above, during which charges $Q_H$ are stored in the capacitor $C_1$ by a voltage $V_0$. After the burst period is elapsed so that the transistor $Q_1$ is turned off, i.e., after $t_1$, the holding capacitor $C_1$ attempts to hold the stored charges $Q_H$.

However, in general, a capacitance $C_{S0}$ between a base and an emitter and a capacitance $C_{S1}$ between a collector and a base exist in a transistor. Thus, when the transistor $Q_1$ is rendered non-conductive so that one end on the side of a base of a capacitance $C_{S0}$ between a base and an emitter of the transistor $Q_1$ becomes a ground potential, the above described charges $Q_H$ are divided into a capacitance $C_1$ of the capacitor $C_1$ and the capacitance $C_{S0}$ between the base and the emitter, as expressed in the following equation:

$$Q_H = C_1 \cdot V_0$$
$$= (C_1 + C_{S0}) \cdot (V_0 - \Delta V)$$

from this equation, we obtain:

$$\Delta V = \frac{C_{S0}}{C_1 + C_{S0}} \cdot V_0$$

Thus, this $\Delta V$ corresponds to the amount of decrease in voltage held in the holding capacitor $C_1$ after $t_1$, as shown in FIG. 2, which becomes ripple.

If the holding capacitor is externally connected to the integrated circuit and the capacitance thereof is relatively large, we obtain:

$$C_1 > C_{S0}$$

and thus $\Delta V$ is extremely small, so that little ripple occurs. However, if the peak holding capacitor $C_1$ is formed in the integrated circuit as a small capacitance of several 10 pF or less as described above, $\Delta V$ becomes large, so that ripple occurs, whereby a correct peak holding operation cannot be performed.

SUMMARY OF THE INVENTION

Therefore, an object of the present invention is to provide a peak holding circuit suitable for formation as an integrated circuit, in which a peak holding capacitor can be formed in the integrated circuit.

Another object of the present invention is to provide a peak holding circuit in which fluctuations is output potential is prevented so that a correct peak holding operation is ensured.

Still another object of the present invention is to provide a peak holding circuit in which power consumption is decreased.

Still another object of the present invention is to provide a peak holding circuit in which occurrence of ripple at a held peak level is prevented.

Still another object of the present invention is to provide an input signal level adjusting apparatus suitable for formation as an integrated circuit by forming as an integrated circuit a peak holding circuit for holding a peak level of the level difference between an input signal and a reference potential.

Still another object of the present invention is to provide an input signal level adjusting apparatus in which a level of an input signal can be properly shifted by correctly holding a peak level of the level difference between a input signal and a reference potential.

Still another object of the present invention is to provide an input signal level adjusting apparatus in which there is no possibility of malfunctions even if sudden noises occur in an input signal.

A further object of the present invention is to provide an input signal level adjusting apparatus in which there is no possibility of malfunctions even if a level of an input signal is greatly fluctuated.

Briefly stated, the peak holding circuit according to the present invention comprises means for supplying an input signal, means for holding a peak level of the supplied input signal, a darlington circuit comprising a plurality of transistors connected in a darlington manner for supplying an output signal in response to the peak level held in the holding means, and at least one current cancelling transistor having a collector connected to an emitter of one transistor out of the plurality of transistors connected in a darlington manner and an emitter connected to ground, wherein a collector cut-off current flowing between the collector and the emitter of the current cancelling transistor being approximately equal to a collector cut-off current flowing through the one transistor out of the plurality of transistors connected in a darlington manner.

In accordance with another aspect of the present invention, the peak level holding means comprises a capacitor for storing signal charges corresponding to a peak level.

In accordance with still another aspect of the present invention, the input signal supplying means comprises a switching transistor, signal charges being supplied to a capacitor and stored therein in an "on" period of the switching transistor and the capacitor holding the signal charges in an "off" period of the switching transistor.

In accordance with still another aspect of the present invention, the switching transistor has its collector connected to one electrode of the capacitor.

In accordance with still another aspect of the present invention, briefly stated, the input signal level adjusting apparatus comprises means for supplying an input signal, means for supplying a reference potential, comparing means for comparing a potential of the input signal with the reference potential to supply a comparison output corresponding to the difference therebetween, and peak holding means for holding a peak level of the comparison output, the peak holding means comprising a capacitor for holding the peak level of the comparison output, a darlington circuit comprising a plurality of transistors connected in a darlington manner for supplying an output signal corresponding to the peak level held in the capacitor, and at least one current cancelling transistor having a collector connected to an emitter of one transistor out of the plurality of transistors connected in a darlington manner and an emitter connected to ground, wherein a collector cut-off current flowing between the collector and the emitter of the current cancelling transistor being approximately equal to a collector cut-off current flowing through the one transistor out of the plurality of transistors connected in a darlington manner, which further comprises level shifting means responsive to the output signal of the darlington circuit for shifting a direct current (DC) level of the input signal.

In accordance with a further aspect of the present invention, the input signal level adjusting apparatus further comprises means responsive to the potential of the input signal for discharging charges stored in the capacitor.

In accordance with a still further aspect of the present invention, the input signal level adjusting apparatus further comprises limiter means provided between the level shifting means and the comparing means for restricting the level of the input signal in a constant range centered at the reference potential.

Thus, a principal advantage of the present invention is that the collector cut-off current flowing through the transistor connected in a darlington manner is allowed to flow between a collector and an emitter of a transistor separately provided to be cancelled, so that the collector cut-off current is not conducted to a transistor in the next stage, whereby fluctuations in output potential of the peak holding circuit can be prevented.

Another advantage of the present invention is that an extra reactive current need not be allowed to flow in order to suppress fluctuations in output potential of the peak holding circuit, so that power consumption can be decreased.

Still another advantage of the present invention is that even when a small capacitance peak holding capacitor is employed for formation as an integrated circuit, the amount of decrease in the held peak level is decreased by connecting the collector of the switching transistor for supplying the input signal to one electrode of the peak holding capacitor, so that occurrence of ripple can be prevented.

Still another advantage of the present invention is that the above described peak holding circuit is applied to the input signal level adjusting apparatus, so that the input signal level adjusting apparatus can be formed as an integrated circuit.

A further advantage of the present invention is that even when sudden noises occur in the input signal, unnecessary charges held in the peak holding capacitor can be instantaneously discharged by detecting the noises.

A still further advantage of the present invention is that even when the level of the input signal is greatly fluctuated, as compared with the reference potential, malfunctions due to the stray capacitance of a transistor constituting a comparator can be prevented by restricting the level of input signal in a constant range.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a schematic block diagram showing a structure of a liquid crystal color television receiver including a pedestal clamp circuit according to a second embodiment of the present invention;

DESCRIPTION OF THE PREFERRED EMBODIMENTS

Figure 3:
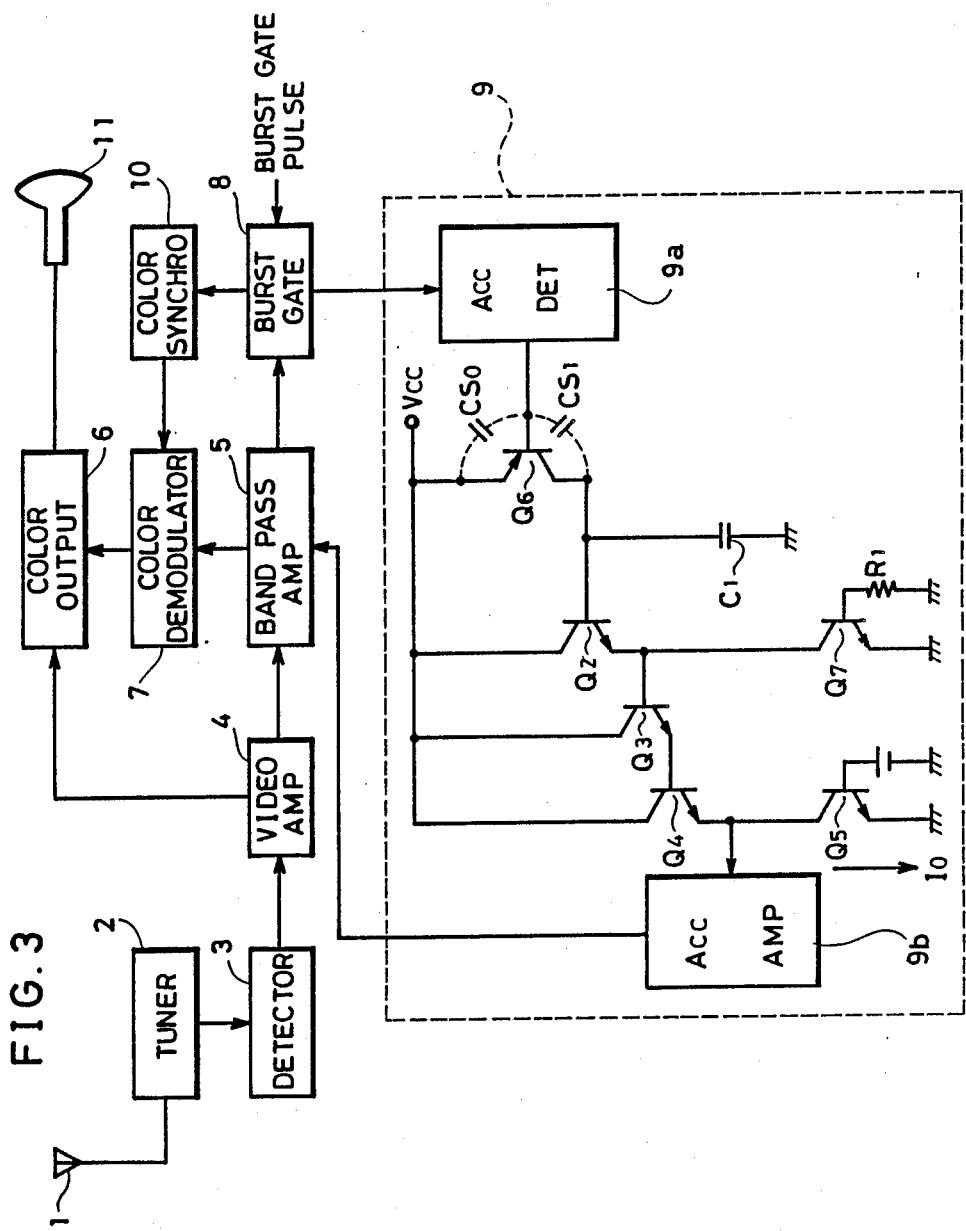
FIG. 3 is a schematic block diagram showing a structure of a color television receiver including an ACC circuit according to a first embodiment of the present invention.

FIG. 3 is a schematic block diagram showing a first embodiment of the present invention, showing a color television receiver having a peak holding circuit according to the present invention incorporated therein as an ACC circuit.

Figure 1:
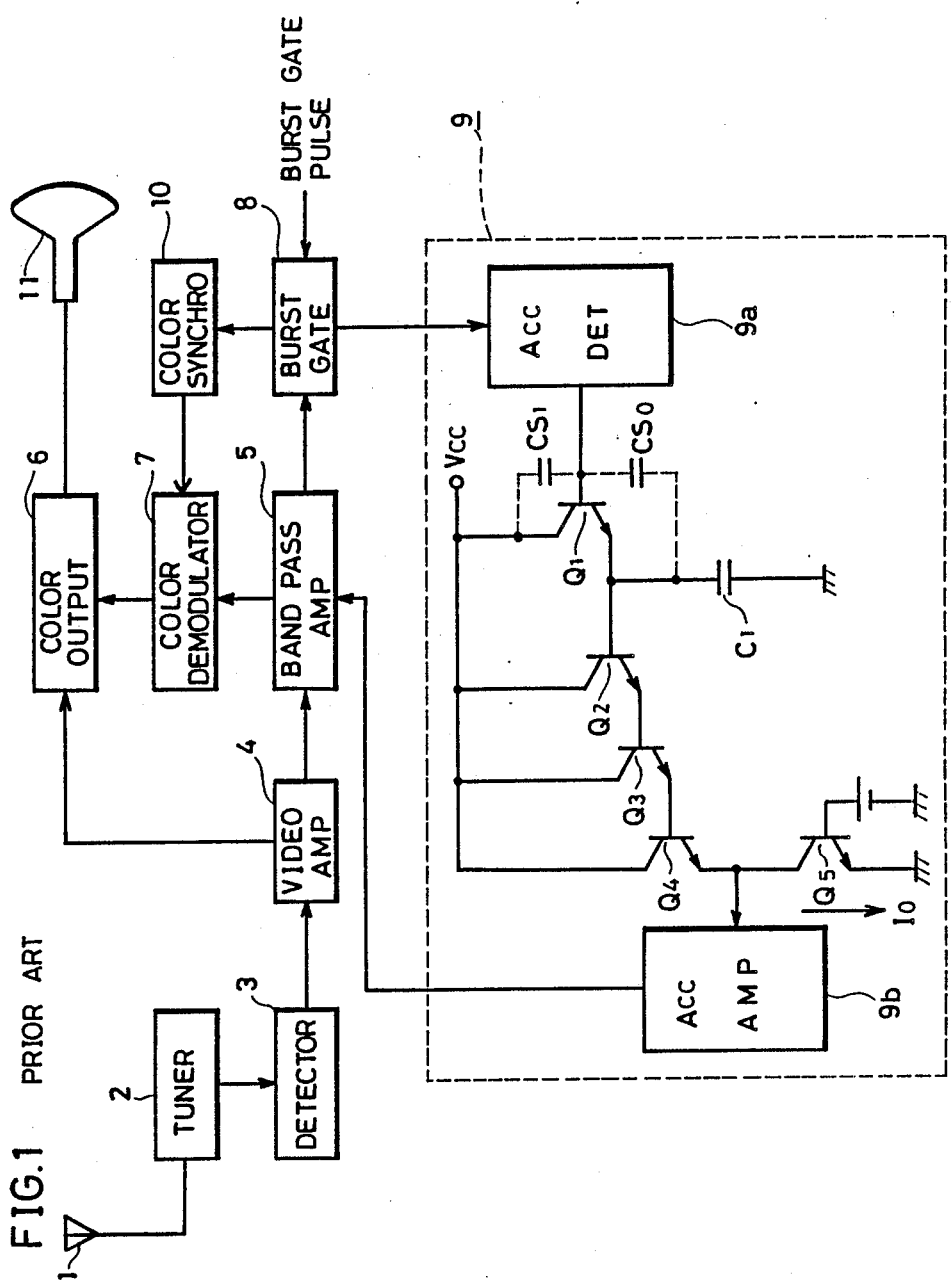
FIG. 1 is a schematic block diagram showing a structure of a color television receiver including a conventional ACC circuit.
Figure 2:
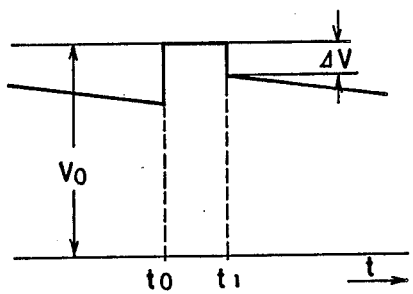
FIG. 2 is a diagram showing the change with time of a holding potential of a peak holding capacitor in the ACC circuit shown in FIG. 1.

The embodiment shown in FIG. 3 is the same as the conventional example shown in FIG. 1 except for the following. More specifically, first, there are provided a transistor $Q_7$ and a resistor $R_1$ connected between a base thereof and a ground potential, the transistor $Q_7$ having its collector connected to an emitter of a transistor $Q_2$ in the first stage out of transistors $Q_2$, $Q_3$ and $Q_4$ connected in a darlington manner. Second, a pnp transistor $Q_6$ is provided in place of the npn transistor $Q_1$ shown in FIG. 1, the pnp transistor $Q_6$ having its emitter connected to a direct current (DC) power supply $V_{CC}$ and its collector connected to one electrode of a holding capacitor $C_1$. The transistors $Q_2$ to $Q_7$, the holding capacitor $C_1$ and the resistor $R_1$ are all formed in the same integrated circuit.

The above described first point will be described in detail. The transistor $Q_7$ has its emitter connected to ground and at the same time, its base connected to ground through the resistor $R_1$. Thus, the transistor $Q_7$ is always off. It is assumed that a collector cut-off current $I_{CER4}$ approximately equal to a collector cut-off current $I_{CER1}$ flowing through the transistor $Q_2$ always flows through this transistor $Q_7$.

Thus, a current flowing through the transistor $Q_4$ in the final stage when the transistor $Q_2$ in the first stage out of the transistors connected in a darlington manner is off is expressed by the following equation:

$$IF = [(I_{CER1} - I_{CER4}) \times B_2 + I_{CER2}] \times B_3 + I_{CER3}$$

where $$I_{CER1} \approx I_{CER4}$$

$$I_{CER2} \cdot B_3 >> I_{CER3}$$

and thus $$IF \approx I_{CER2} \cdot B_2$$

More specifically, in the embodiment shown in FIG. 3, the collector cut-off current $I_{CER1}$ flowing through the transistor $Q_2$ is cancelled by the collector cut-off current $I_{CER4}$ flowing through the transistor $Q_7$. Thus, in spite of three-stage darlington connection, the current IF flowing through the transistor $Q_4$ is equivalent to that in the case of two-stage darlington connection. If concrete numerical values are substituted to calculate the current IF, we obtain:

$$IF \approx 0.01 \ \mu A \times 300 = 3 \ \mu A$$

Consequently, there occurs little rise in output potential of the transistor $Q_4$ due to the collector cut-off current flowing through the transistor connected in a darlington manner. Thus, a reactive current flowing through the transistor $Q_5$ serving as a constant current source may be less than that in the conventional example shown in FIG. 1, so that power consumption can be significantly decreased.

Meanwhile, if a transistor similar to the above described transistor $Q_7$ is connected to an emitter of the transistor $Q_3$, we obtain:

$$IF \approx I_{CER3}$$

thus, the current IF can be further decreased.

Additionally, the collector cut-off current flowing through the transistor $Q_7$ may be $I_{CEO}$ and $I_{CES}$ other than the above described $I_{CER}$. More specifically, the base of the transistor $Q_7$ may be opened or the base and the emitter thereof may be short-circuited.

The above described second point will be described. As described above, the pnp transistor $Q_6$ has its emitter connected to the DC power supply $V_{CC}$ and its collector connected to one electrode of the holding capacitor $C_1$. Thus, the transistor $Q_6$ functions as a constant current type driving circuit for the holding capacitor $C_1$.

Figure 4:
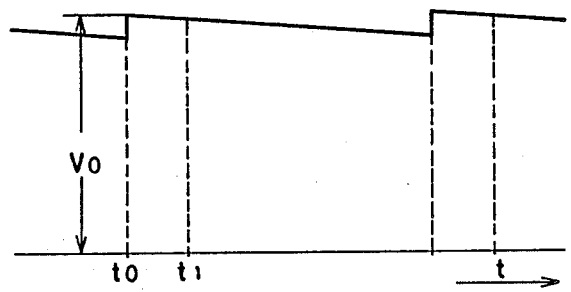
FIG. 4 is a diagram showing the change with time of the holding potential of the peak holding capacitor in the ACC circuit shown in FIG. 2.

FIG. 4 is a diagram showing the change with time of a voltage held in the holding capacitor $C_1$ shown in FIG. 3. The transistor $Q_6$ is turned on in response to a low output from an ACC detector circuit 9a in a burst period (a period of $t_0$ to $t_1$ shown in FIG. 4), during which charges $Q_H$ are stored in the capacitor $C_1$ by a voltage $V_0$. In the transistor $Q_6$, there exist a capacitance $C_{S0}$ between a base and the emitter thereof and a capacitance $C_{S1}$ between the collector and the base thereof. Thus, when the transistor $Q_6$ is turned off, the above described charges $Q_H$ to be held in the capacitor $C_1$ are divided into a capacitance $C_1$ of the capacitor $C_1$ and the capacitance $C_{S1}$ between the collector and the base, as expressed in the following equation:

$$Q_H = C_1 \cdot V_0$$
$$= (C_1 + C_{S1}) \cdot (V_0 - \Delta V)$$

from this equation, $$\Delta V = \frac{C_{S1}}{C_1 + C_{S1}} \cdot V_0$$

However, since generally, $C_{S1} >> C_{S0}$, $\Delta V$ is small as shown in FIG. 4, so that a voltage held in the capacitor $C_1$ is hardly lowered. As a result, ripple does not occur.

Although in the embodiment shown in FIG. 3, the transistor $Q_6$ has its base connected to the ACC detector circuit 9a, it is necessary to structure the constant current type driving circuit such that the transistor $Q_6$ has its collector connected to one electrode of the holding capacitor $C_1$. For example, the constant current type driving circuit may be structured such that the transistor $Q_6$ has its emitter connected to the ACC detector circuit 9a and its base connected to the DC power supply $V_{CC}$.

As described in the foregoing, according to the first embodiment shown in FIG. 3, the collector cut-off current $I_{CER}$ flowing through the transistor connected in a darlington manner can be cancelled without being conducted to the next stage, so that a constant current source need not be connected to an emitter of the transistor in the final stage to allow an extra reactive current to flow, whereby power consumption can be decreased. In addition, even if the peak holding capacitor having a capacitance value of several 10 pF is employed which can be formed in an integrated circuit, ripple never appears in a holding voltage of this capacitor, whereby a correct peak holding operation can be ensured. As a result, the peak holding capacitor can be formed in the integrated circuit without difficulty. Thus, the number of terminals for elements externally connected to the integrated circuit can be decreased.

FIG. 5 is a schematic block diagram showing a second embodiment of the present invention, showing a liquid crystal color television receiver having a peak holding circuit according to the present invention incorporated therein as a pedestal clamp circuit.

In FIG. 5, a color television signal is received by a receiving antenna 21 and a tuner 22, from which a video signal is further extracted by a detector circuit 23, to be applied to a synchronizing separator circuit 24 and a chroma color demodulator circuit 25. Color difference signals R-Y, G-Y and B-Y demodulated by the chroma color demodulator circuit 25 are applied in parallel to a matrix circuit 26. In the matrix circuit 26, the color difference signals R-Y, G-Y and B-Y are mixed with a luminance signal Y, to be primary color signals R, G and B, respectively. The primary color signals are applied in parallel to a pedestal clamp circuit 27. The pedestal clamp circuit 27 aims at compensating for variations and fluctuations in a DC level of each of the signals R, G and B, which is responsive to a burst gate pulse applied from a well-known burst gate pulse generating circuit (not shown) for comparing a pedestal level (black level) of each of the primary color signals with a reference level during a burst period (pedestal period) to hold the level difference therebetween, and suitably shifting the DC level of each of the primary color signals in response to the level difference, as described below. As such a pedestal clamp circuit, a video signal level adjusting apparatus has been conventionally known, which is disclosed in, for example, Japanese Patent Laying-Open Gazette No. 126817/1978. In the second embodiment as described below, the peak holding circuit according to the present invention is applied to such a conventional pedestal clamp circuit to facilitate formation as an integrated circuit.

The primary color signals R, G and B respectively having DC levels as compensated for by the pedestal clamp circuit 27 as described above are applied to a color switching control circuit 28. In general, a liquid crystal can not normally perform display operation when it is driven by a direct current (DC), so that life is decreased. Thus, the liquid crystal must be driven by an alternating current (AC). Therefore, the liquid crystal color television receiver reverses the polarity of each of the primary color signals every field (or line), to drive a liquid crystal panel by the alternating current. Consequently, a level changing circuit 29 reverses the polarity of each of the primary color signals, so that a positive signal and a negative signal are alternately selected in response to a vertical synchronizing signal by the color switching control circuit 28, to be applied to a Y driver 30. A color liquid crystal panel 31 is scanned in a line sequential manner by the Y driver 30 and an X driver 32.

The chroma color demodulator circuit 25, the matrix circuit 26, the pedestal clamp circuit 27, the color switching control circuit 28 and the level changing circuit 29 as described above constitute a single integrated circuit (for example, 1A7660M made of Sanyo Electric Co., Ltd.).

Figure 6:
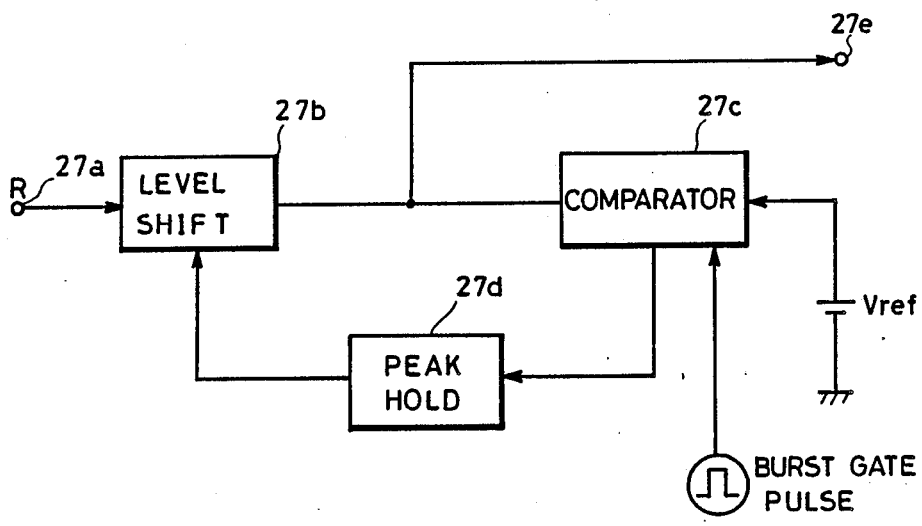
FIG. 6 is a block diagram showing a level adjusting circuit constituting the pedestal clamp circuit shown in FIG. 5.

FIG. 6 is a block diagram for explaining a level adjusting circuit constituting the pedestal clamp circuit 27 shown in FIG. 5. In the pedestal clamp circuit 27 shown in FIG. 5, the level adjusting circuits shown in FIG. 6 are provided in parallel for each primary color signals R, G and B. In FIG. 6, it is assumed that a primary color signal R, for example, is applied to an input terminal 27a from the matrix circuit 26 shown in FIG. 5. The primary color signal R applied to the input terminal 27a is applied to one input of a comparator 27c through a level shifting circuit 27b. In addition, it is assumed that a reference voltage Vref is applied to the other input of the comparator 27c. The comparator 27c is responsive to a burst gate pulse for comparing a pedestal level of the inputted primary color signal with the reference potential Vref only in a burst period (pedestal period). A comparision output of the comparator 27c is held in a peak holding circuit 27d to which the present invention is applied, so that a holding potential thereof is fed back to the level shifting circuit 27b. The level shifting circuit 27b is responsive to the level difference held in the peak holding circuit 27d for shifting a DC level of the primary color signal R, thereby compensating for variations and fluctuations in the DC level. A primary color signal R having DC level as compensated for is outputted from an output terminal 27e and applied to the color switching control circuit 28 (FIG. 5) in the next stage.

Figure 7:
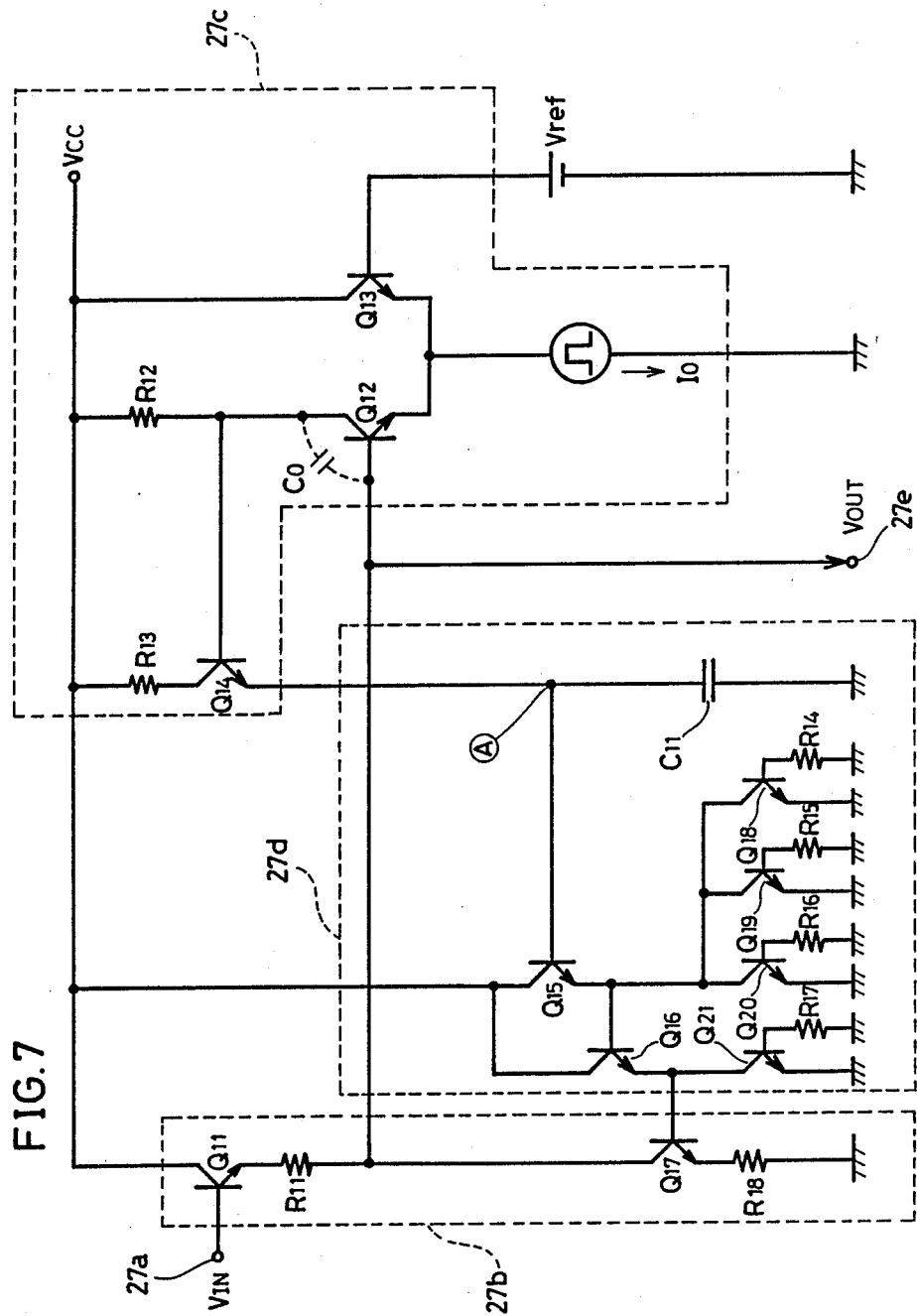
FIG. 7 is a circuit diagram showing specifically the level adjusting circuit shown in FIG. 6.

Additionally, FIG. 7 is a circuit diagram showning specifically the level adjusting circuit shown in FIG. 6. In FIG. 7, a primary color signal R of a potential $V_{IN}$ is applied to an input terminal 27a. This primary color signal is applied to a base of one transistor $Q_{11}$ out of transistors constituting a level shifting circuit 27b. An emitter output of the transistor $Q_{11}$ is applied to a base of one transistor $Q_{12}$ out of transistors constituting a comparator 27c through a resistor $R_{11}$. In addition, a reference potential Vref is applied to a base of the other transistor $Q_{13}$ out of the transistor constituting the comparator 27c. A constant current source of the comparator 27c allows a current $I_O$ to flow only when a burst gate pulse is generated. If a base potential of the transistor $Q_{12}$ is higher than a base potential of a transistor $Q_{13}$ during the period, the transistor $Q_{12}$ is turned on, so that the current $I_O$ flows. Consequently, a transistor $Q_{14}$ is turned on due to the voltage drop of a resistor $R_{12}$, so that charges are stored in a peak holding capacitor $C_{11}$ in a peak holding circuit 27d. A holding potential of this capacitor $C_{11}$ is applied to a base of a transistor $Q_{15}$ in the first stage out of transistors $Q_{15}$, $Q_{16}$ and $Q_{17}$ connected in a triple darlington manner. The transistor $Q_{17}$ in the final stage corresponds to the other transistor out of the transistors constituting the level shifting circuit 27b. More specifically, a DC output level of the level shifting circuit 27b is shifted by a current flowing through the transistor $Q_{17}$ in response to the holding potential of the peak holding capacitor $C_{11}$, i.e., the level difference between the inputted primary color signal and the reference potential, so that a DC level of a primary color signal $V_{OUT}$ outputted from an output terminal 27e is compensated for.

In the level shifting circuit 27b and the peak holding circuit 27d, a triple darlington circuit comprising the transistors $Q_{15}$, $Q_{16}$ and $Q_{17}$ connected in a darlington manner is employed as in the first embodiment shown in FIG. 3, so that the input impedance at A point shown in FIG. 7 can be increased. As a result, a capacitance of the peak holding capacitor $C_{11}$ can be set to several 10 pF or less. As a result, the peak holding capacitor $C_{11}$ can be formed in an integrated circuit. In addition, a collector cut-off current flowing through a transistor connected in a darlington manner is cancelled by connecting a similar transistor to an emitter of the transistor as in the first embodiment shown in FIG. 3, so that correct level shifting of an input signal can be made without affecting the current flowing through the transistor $Q_{17}$ in the final stage. Particularly, in this example shown in FIG. 7, three transistors $Q_{18}$, $Q_{19}$ and $Q_{20}$ which are always off are connected in parallel between an emitter of the transistor $Q_{15}$ in the first stage in the darlington circuit and a ground potential, and a transistor $Q_{21}$ which is always off is further connected between an emitter of the transistor $Q_{16}$ in the next stage and the ground potential, so that such an extra collector cut-off current is decreased more thoroughly.

Meanwhile, in the circuit shown in FIG. 7, since the capacitance of the peak holding capacitor $C_{11}$ is small, i.e., several 10 pF or less, the amount of current flowing through the transistor $Q_{14}$ for supplying charges to the peak holding capacitor $C_{11}$ must be made very small. More specifically, if the amount of current flowing through the transistor $Q_{14}$ is set larger than necessary, oscillation occurs in a DC level adjusting loop because the capacitance of the capacitor $C_{11}$ is small and the input impedance of the transistor $Q_{15}$ is large, so that a level of an input signal may not be pulled into a reference level. In order to reduce the amount of current flowing through the transistor $Q_{14}$, it is necessary to increase respective resistance values of resistors $R_{12}$ and $R_{13}$ and decrease the current $I_O$ supplied from the constant current source which is operated only in the burst period.

However, assuming that $I_O$ is a very small current and the resistance value of the resistor $R_{12}$ is, for example, several 10 KΩ to 100 KΩ, if an input signal having a larger level difference, as compared with the reference potential Vref is applied to the base of the transistor $Q_{12}$, the effect of a capacitance $C_O$ between the base and a collector of the transistor $Q_{12}$ cannot be ignored.

More specifically, assuming that a potential difference of $\Delta V$ appears in the input signal, the movement of charges denoted by $Q = C_O \times \Delta V$, i.e., a current occurs due to the capacitance between the base and the collector of the transistor $Q_{12}$. Thus, considering a case in which the value of the resistor $R_{12}$ is set high as described above, even when the constant current $I_O$ does not flow, the transistor $Q_{14}$ is unnecessarily turned on due to a charging/discharging current of the capacitance $C_O$ between the base and the collector.

On the other hand, in the circuit shown in FIG. 7, when noise suddenly occurs in the pedestal level during the pedestal period of the input signal, the transistors $Q_{12}$ and $Q_{14}$ are liable to be turned on due to the noise so that the peak holding capacitor $C_{11}$ is unnecessarily charged. However, in the circuit shown in FIG. 7, there is not provided means for cancelling charges stored in the capacitor $C_{11}$ due to unnecessary charging.

Figure 8:
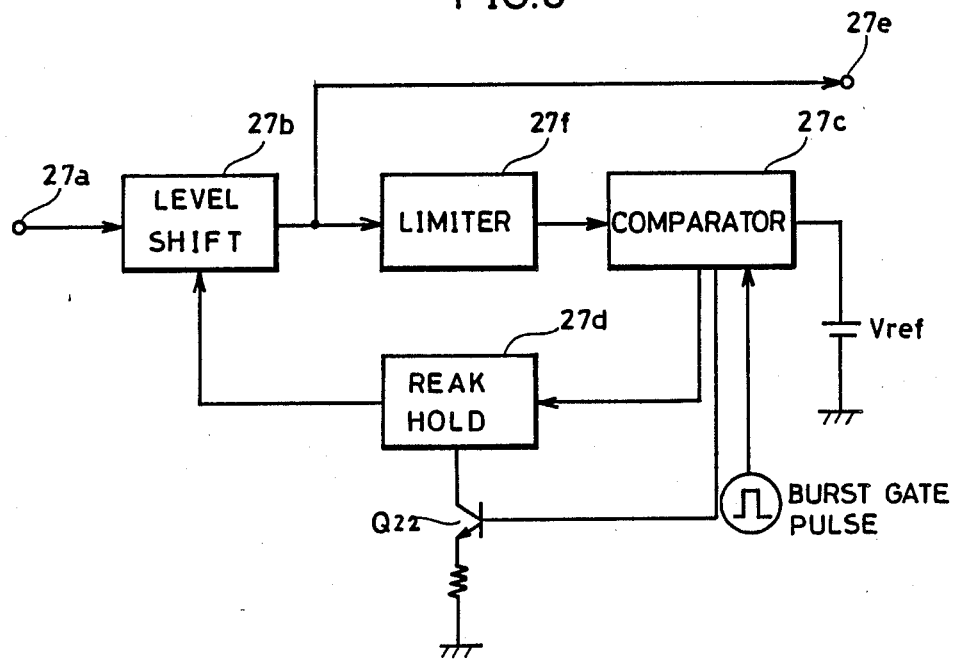
FIG. 8 is a block diagram showing a modified example of the level adjusting circuit shown in FIG. 6.

FIG. 8 is a block diagram showing an improvement of the level adjunsting circuit shown in FIG. 6 in order to solve the above described problems.

The level adjusting circuit shown in FIG. 8 differs from the level adjusting circuit shown in FIG. 6 in that a limiter circuit 27f is further provided between the level shifting circuit 27b and the comparator 27c so that an input level higher than necessary is not added to an input of the comparator 27c.

Furthermore, there is provided a transistor $Q_{22}$ for discharging charges as unnecessarily charged in the peak holding capacitor $C_{11}$ due to the noises in the pedestal period. This transistor $Q_{22}$ is turned on in response to a signal from the comparator 27c simultaneously with the termination of the noises in an input signal, to instantaneously discharge the unnecessary charges stored in the capacitor $C_{11}$.

Figure 9:
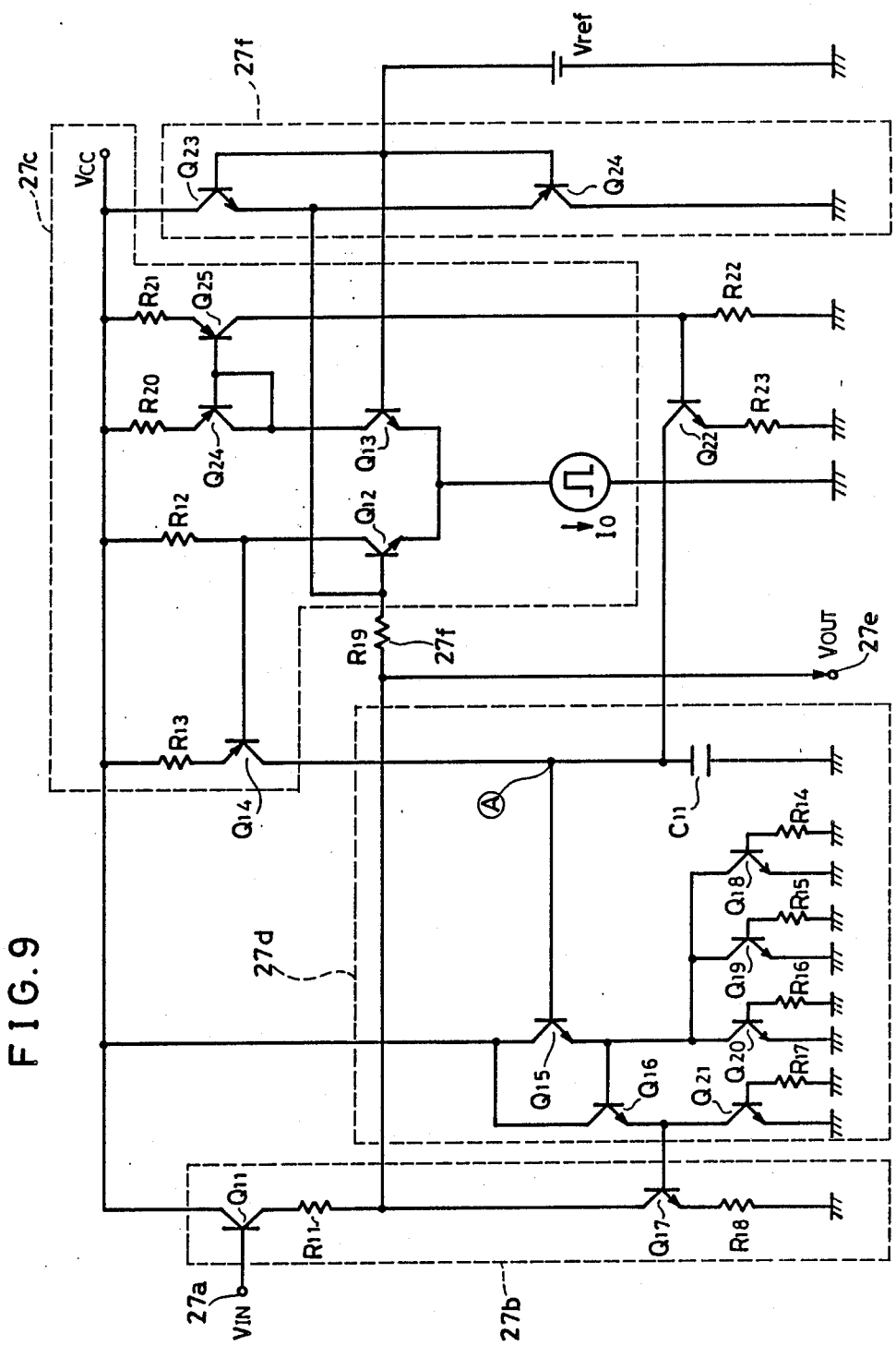
FIG. 9 is a circuit diagram showing specifically the level adjusting circuit shown in FIG. 8.

In addition, FIG. 9 is a circuit diagram showing specifically a level adjusting circuit shown in FIG. 8. The above described limiter circuit 27f comprises a resistor $R_{19}$ and transistors $Q_{23}$ and $Q_{24}$. Therefore, a level of an input signal applied to a base of a transistor $Q_{12}$ in a comparator 27c is restricted in a range of a reference potential Vref±Vf (Vf denotes a voltage between a base and an emitter of a transistor, i.e., approximately 0.7 V). Thus, the amount of a charging/discharging current caused by a capacitance $C_O$ between the base and a collector of the transistor $Q_{12}$ is restricted. Thus, even when a level of an inputted primary color signal is large, a transistor $Q_{14}$ is prevented from being erroneously turned on, so that a DC level can be correctly compensated for.

Additionally, even if the transistor $Q_{14}$ is turned on due to sudden noises in the input signal during a pedestal period so that charges are once stored in a capacitor $C_{11}$, the termination of the noises is detected by a pair of transistors $Q_{12}$ and $Q_{13}$, a detected signal is applied to a base of a transistor $Q_{22}$, and charges stored in the capacitor $C_{11}$ is instantaneously discharged.

As described in the foregoing, according to the embodiment of the present invention, even when darlington connection of transistors is employed so that a capacitance of a peak holding capacitor is decreased, whereby the capacitor can be formed within an integrated circuit, a peak holding circuit can be achieved which can prevent malfunctions due to a collector cut-off current without increasing power consumption and is not easily affected by large fluctuations in a level of an input signal and noises which occur in the input signal.

Although in the above described embodiment, the present invention is applied to a peak holding circuit serving as an ACC circuit and a pedestal clamp circuit in a color television receiver, the present invention can be applied to any peak holding circuit using darlington connection.

Although the present invention has been described and illustrated in detail, it is clearly understood that the same is by way of illustration and example only and is not to be taken by way of limitation, the spirit and scope of the present invention being limited only by the terms of the appended claims.

what is claimed is:

1. A peak holding circuit for holding a peak level of an input signal, comprising:
    means for supplying said input signal;
    means for holding the peak level of said supplied input signal;
    a darlington circuit comprising a plurality of transistors connected in a darlington manner for supplying an output signal in response to the peak level held in said holding means, said darlington circuit having at least a first stage output transistor; and
    at least one current cancelling transistor having an emitter connected to ground and a collector connected to an emitter of said first stage output transistor out of said plurality of transistors connected in a darlington manner wherein a collector cut-off current flowing between said collector and said emitter of said current cancelling transistor being approximately equal to a collector cut-off current flowing through said first stage output transistor out of said plurality of transistors connected in a darlington manner.

2. The peak holding circuit according to claim 1, which further comprises:
    at least one additional current cancelling transistor having an emitter connected to ground and a collector connected to an emitter of one transistor different from said first stage output transistor out of said plurality of transistors connected in a darlington manner, wherein a collector cut-off current flowing between said collector and said emitter of said additional current cancelling transistor being approximately equal to a collector cut-off current flowing through said one transistor different from said first stage output transistor out of said plurality of transistors connected in a darlington manner.

3. The peak holding circuit according to claim 1, wherein
    said holding means comprises a capacitor for storing signal charges corresponding to said peak level.

4. The peak holding circuit according to claim 3, wherein
    said input signal supplying means comprises a switching transistor,
    said signal charges being supplied to said capacitor and stored therein in an "on" period of said switching transistor, and
    said capacitor holding said signal charges in an "off" period of said switching transistor.

5. The peak holding circuit according to claim 4, wherein
said switching transistor has its collector connected to one electrode of said capacitor.

6. The peak holding circuit according to claim 4, which further comprises
means for discharging the charges stored in said capacitor.

* * * * *